(12) United States Patent
Igarashi

(10) Patent No.: US 6,686,251 B2
(45) Date of Patent: Feb. 3, 2004

(54) METHOD FOR FABRICATING A BIPOLAR TRANSISTOR HAVING SELF-ALIGNED EMITTER AND BASE

(75) Inventor: Tomohiro Igarashi, Yamagata (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/227,414

(22) Filed: Aug. 26, 2002

(65) Prior Publication Data

US 2003/0045066 A1 Mar. 6, 2003

(30) Foreign Application Priority Data

Aug. 27, 2001 (JP) ........................................ 2001-255875

(51) Int. Cl.[7] ............................................. H01L 21/331
(52) U.S. Cl. ........................ 438/364; 436/309; 436/366
(58) Field of Search ................................. 438/309, 364, 438/366

Primary Examiner—Long Pham
(74) Attorney, Agent, or Firm—Sughrue Mion, PLLC

(57) ABSTRACT

A method for forming a self-aligned bipolar transistor includes the steps of combination etching a silicon substrate in an opening to form a concave surface on the silicon substrate, and forming an intrinsic base and an associated emitter on the concave surface. The combination etching includes an isotropic etching and subsequent wet etching. The concave surface increases the distance between the external base for the intrinsic base and the emitter to thereby increase the emitter-base breakdown voltage.

5 Claims, 10 Drawing Sheets

METHOD FOR FABRICATING A BIPOLAR TRANSISTOR HAVING SELF-ALIGNED EMITTER AND BASE

BACKGROUND OF THE INVENTION (a) Field of the Invention

The present invention relates to a method for fabricating a bipolar transistor having self-aligned base and emitter. The present invention also relates to such a semiconductor device.

(b) Description of the Related Art

Semiconductor deices including therein bipolar transistors have been developed to achieve higher-speed and higher-performance operation. This development is attempted by using finer patterning techniques, wherein the parasitic capacitance and the base resistance of the bipolar transistor are reduced while reducing the junction depth thereof to thereby reduce the transit time of the carriers. One of such patterning techniques is a self-alignment fabrication technique for a bipolar transistor, wherein the emitter region and the base region are separated in a self-alignment scheme, and impurities are introduced from the base lead electrode formed in the periphery of the bipolar transistor to form an external base (or graft base) on the outer periphery of the base region.

In a bipolar transistor having such a self-alignment structure, it is important to reduce the effective emitter width for obtaining excellent high-frequency characteristics such as a steep cut-off frequency (fT) and a high oscillation frequency (fmax). In addition, it is also important not to form a void in a polysilicon layer connected to the emitter region and in the emitter lead electrode connected to the polysilicon layer, thereby obtaining high reliability and a lower emitter resistance of the bipolar transistor.

For example, in order to obtain an excellent oscillation property for a self-aligned bipolar transistor used in a LC oscillator, a higher breakdown voltage (BVebo) should be achieved therein because forward bias and reverse bias are alternately applied in the emitter-base junction. In addition, low-frequency noise should be removed in the self-aligned bipolar transistor if it is used in a voltage controlled oscillator.

FIGS. 14 to 18 consecutively show steps of a conventional fabrication process for a semiconductor device having a self-aligned bipolar transistor. As shown in FIG. 14, the process begins with a silicon substrate 101 on which a first silicon oxide film 102 is formed by a thermal oxidation technique, followed by selectively etching a portion of the first silicon oxide film 102 on the emitter region (region for forming the emitter) and the intrinsic base region (region for forming the intrinsic base 108) by using a photolithographic technique. Subsequently, a first polysilicon layer 103 is deposited on the first silicon oxide film 102 by using a CVD technique, followed by implanting boron ions into the first polysilicon layer 103 by using an ion-implantation technique.

Thereafter, the first polysilicon layer 103 is selectively etched using a photolithographic technique, followed by deposition of a first silicon nitride film 104 by using a CVD technique on both the first polysilicon layer 103 and the first silicon oxide film 102 exposed from the etched first polysilicon layer 103. Subsequently, the first polysilicon layer 103 and the first silicon nitride film 104 are selectively etched to form an opening 105 which exposes the base region other than a graft base region.

Subsequently, a second silicon oxide film 106 is formed using a thermal oxidation technique on the wall and the bottom of the opening 105, the second silicon oxide film 106 serving as a diffusion assist layer. Thereafter, boron ions are implanted through the bottom of the second silicon oxide film 106 into the silicon substrate 101 by using an ion-implantation technique, thereby forming an intrinsic base 108. A second silicon nitride film 107 is then deposited in the opening 105 by using a CVD technique, followed by depositing a second polysilicon layer 110 on the first silicon nitride film 104 in the opening 105, as shown in FIG. 14.

Subsequently, as shown in FIG. 15, the second polysilicon layer 110 is selectively removed by an anisotropic dry etching technique, to leave a first side-wall polysilicon layer 110a on the second silicon nitride film 107 in the opening 105. The anisotropic dry etching is conducted using reactive ions under the gas ambient wherein the etch rate for the polysilicon layer is larger compared to the etch rate for the silicon nitride film. The gas ambient is such that $Cl_2$, HBr and He are introduced at flow rates of 5 to 50 sccm (standard cubic centimeters), 10 to 100 sccm and 1 to 10 sccm, respectively, for example.

During the anisotropic dry etching step, the ions reflected by the first side-wall polysilicon layer 110a in the opening 105 are concentrated on the bottom of the inner side of the polysilicon layer 110a, thereby increasing the etched amount of the bottom of the opening 105 to form a trench 111 on the bottom. The trench 111 may penetrate the second silicon nitride film 107 to reach the second silicon oxide film 106, as shown in FIG. 15. Although the thick second silicon nitride film 107 reduces the aspect ratio of the opening 105 for preventing occurrence of voids in the polysilicon layer etc, in the opening 105, sufficient over-etching is not conducted for the thick second silicon nitride film 107 for avoiding a larger depth for the trench 111.

Subsequently, as shown in FIG. 16, another anisotropic dry etching process is conducted using the first side-wall polysilicon layer 110a as a mask to remove a portion of the second silicon nitride film 107 on the emitter region. The gas ambient in the another anisotropic dry etching is such that the etch rate for the silicon nitride film is larger than the etch rate for the silicon oxide film. For example, $SF_6$ and He are introduced during the another anisotropic dry etching at flow rates of 40 to 200 sccm and 50 to 250 sccm, respectively, while using reactive ions. The another dry etching increases the depth of the trench 111 to form a deep trench 111a, which penetrates the second silicon oxide film 106 to reach the intrinsic base 108.

Subsequently, wet etching is conducted using a mixture of HF, $HNO_3$ and $CH_3COOH$ to remove the first side-wall polysilicon layer 110a within the opening 105, further increasing the depth of the trench 111a which has already reached the intrinsic base 108.

Subsequently, as shown in FIG. 17, a portion of the second silicon oxide film 106 on the emitter region is removed by wet etching using a hydrofluoric acid based liquid. Thereafter, the native oxide film on the intrinsic base region is removed by using a hydrofluoric acid based liquid, followed by depositing a second polysilicon layer 113 while introducing $SiH_4$ gas into the deposition chamber. Arsenic ions are then introduced into the second polysilicon layer 113 by using an ion-implantation technique.

Subsequently, an emitter injection treatment is conducted wherein an emitter 114 is formed by diffusing the arsenic ions in the third polysilicon layer 113 toward the intrinsic base 108 by solid phase diffusion. In this emitter injection treatment, although the trench 111a filled with the third polysilicon layer 113 does not penetrate the intrinsic base 108, there is some possibility depending on the process conditions that the diffused ions allow the trench 111a to electrically penetrate the intrinsic base 108 while diffusing toward the silicon substrate 101 which constitutes the collector. Thereafter, a portion of the second polysilicon layer 113 is selectively removed.

Subsequently, as shown in FIG. 18, a first interlayer dielectric film 115 is formed on the first silicon nitride film 104 and the second polysilicon layer 113, followed by selectively etching thereof on the second polysilicon layer 113 and forming consecutively an emitter barrier metal layer 119 having a hollow cylindrical shape and an emitter lead electrode 120 having a solid cylindrical shape.

Further, an emitter electrode 121 having a planar size larger than the planar size of the emitter barrier metal layer 119 is formed on top of the emitter lead electrode 120. Similarly, a base barrier metal layer 116, a base lead electrode 117 and a base electrode 118 as well as a collector barrier metal layer 122, a collector lead electrode 123 and a collector electrode 124 are formed to obtain the structure of the bipolar transistor shown in FIG. 18.

In the conventional fabrication process for the bipolar transistor as described above, if the trench 111a electrically penetrates the intrinsic base 108, a short circuit failure occurs between the collector and the emitter to prevent a normal device operation of the bipolar transistor. Even if the trench 111a does not electrically penetrate the intrinsic base 108, the emitter 114 formed on the planar surface of the intrinsic base 108 does not allow a sufficient large distance between the emitter 114 and the graft base 109. This reduces the breakdown voltage of the emitter-base junction (BVebo) down to as low as 1.8 volts, for example.

Another conventional technique for fabricating a semiconductor device having a bipolar transistor is described in Patent Publication JP-A-2-22827 and a literature entitled "NARROW BF$_2$ IMPLANTED BASES FOR 35 GHz/24 ps HIGH-SPEED Si BIPOLAR TECHNOLOGY" in "IEDM91 Technical Digest", pp. 459–462, by K. Ehinger et.al. In this conventional technique, the self-aligned bipolar transistor formed by using an isotropic dry etching for an epitaxial base layer in an opening has a similar problem in that the bipolar transistor has a lower breakdown voltage of the emitter-base junction.

Another conventional technique is also described in Patent Publication JP-A-7-307347. In this conventional technique, the self-aligned bipolar transistor is fabricated by using an isotropic dry etching technique wherein an epitaxial base layer having an opening is etched by a 3 to 9 nm depth. Although the isotropic dry etching used in this technique reduces the damage on the base layer compared to the case of using the anisotropic dry etching, there arises another problem in that the plasma or electrons generated during the isotropic dry etching step generates crystal defects which cause generation and recombination of carriers to thereby increase the low-frequency noise in the resultant bipolar transistor.

Earlier JP Patent Application 2000-071181 also proposes a technique using an isotropic dry etching step in fabrication of the self-aligned bipolar transistor, wherein an epitaxial base layer in an opening is etched. The proposed technique does not remove the damage caused by the isotropic dry etching on the base, although this technique has an advantage in that the electrostatic breakdown voltage can be improved without increasing the base-collector capacitance.

Another conventional technique is described in JP-A-9-172064, wherein the fabrication step for forming the side-wall is conducted twice separately to obtain a two-layer structure for the side-wall in an insulated-gate transistor, such as a longitudinal MOSFET, having a trench. By an anisotropic dry etching using the side-wall having the two-layer structure as a mask, a trench is formed in the silicon substrate by reactive ions.

If the technique described in JP-A-9-172064 is applied to forming a semiconductor device having the self-aligned bipolar transistor, an advantage of smaller effective emitter size may be obtained. In this technique, however, the ions reflected by the wall of the opening in the anisotropic dry etching are concentrated on the bottom edge of the opening to form a trench, similarly to the conventional technique described with reference to FIGS. 14 to 18. The trench may allow the arsenic ions to diffuse and reach the silicon substrate constituting the collector during the emitter injection treatment for forming the emitter, whereby a short-circuit failure occurs between the emitter and the collector and thus a normal device operation cannot be obtained.

SUMMARY OF THE INVENTION

In view of the above problems in the conventional techniques, it is an object of the present invention to provide a method for fabricating a semiconductor device having a self-aligned bipolar transistor, which is capable of improving the emitter-base breakdown voltage, preventing the damage of the base layer caused by plasma or electrons such as occurring in the isotropic dry etching, and reducing the low-frequency noise caused by the crystal defects associated with the generation and recombination of carriers.

It is another object of the present invention to provide a method for fabricating a semiconductor device having a self-aligned bipolar transistor, which is suppressing occurrence of a short-circuit failure between the collector and the emitter to obtain a normal device operation.

It is another object of the present invention to provide a semiconductor device having less mount of voids in a polysilicon layer in electric contact with the emitter.

The present invention provides a method for fabricating a bipolar transistor in a semiconductor device, the method including the steps of: forming a silicon layer on a semiconductor substrate; selectively etching the silicon layer to form an opening for exposing a first portion of the semiconductor substrate; conducting a combination etching to the first portion to form a concave surface thereon, the combination etching including consecutive isotropic dry etching and wet etching; implanting first-conductivity type impurities through the concave surface to the first portion to form an intrinsic base; and implanting second-conductivity type impurities into a surface portion of the intrinsic base to form an emitter on the intrinsic base.

In accordance with the method of the present invention, since the damage of the intrinsic base layer caused by the isotropic dry etching is alleviated by the subsequent wet etching, the crystal defects associated with the generation and recombination of carriers can be reduced to thereby suppress the low-frequency noise. The consecutive isotropic dry etching and wet etching allows the bottom surface of the opening having a trench to assume a smooth concave surface. The emitter formed on the concave surface which constitutes the intrinsic base allows a larger distance to be obtained between the central intrinsic base and the peripheral emitter due to the concave surface compared to the distance obtained in the case of the planar surface of the intrinsic base such as in the conventional technique. The larger distance raises the emitter-base breakdown voltage, whereas the concave surface of the intrinsic base alleviates the concentration of the current which has otherwise a tendency to flow the corner of the intrinsic base in the vicinity of the graft base region.

In the present invention, the first and second conductivity types may be p-type and n-type, respectively, or vice versa.

The present invention also provides a semiconductor device including a bipolar transistor having self-aligned emitter and base, the semiconductor device including: a semiconductor substrate; a silicon layer formed on the semiconductor substrate; an opening formed in the silicon layer for exposing an area in which the self-aligned emitter and base are formed; and a side-wall oxide film formed on bottom and wall of the opening.

The semiconductor device of the present invention can be manufactured by the method of the present invention, and achieve the advantages of suppression of occurrence of voids in the silicon layer. The silicon layer may be preferably a polysilicon layer.

The term "self-aligned bipolar transistor" as used herein means the structure wherein the opening formed for forming the base of the bipolar transistor is used to define the location of the emitter with respect to the base.

PREFERRED EMBODIMENTS OF THE INVENTION

Figure 1:
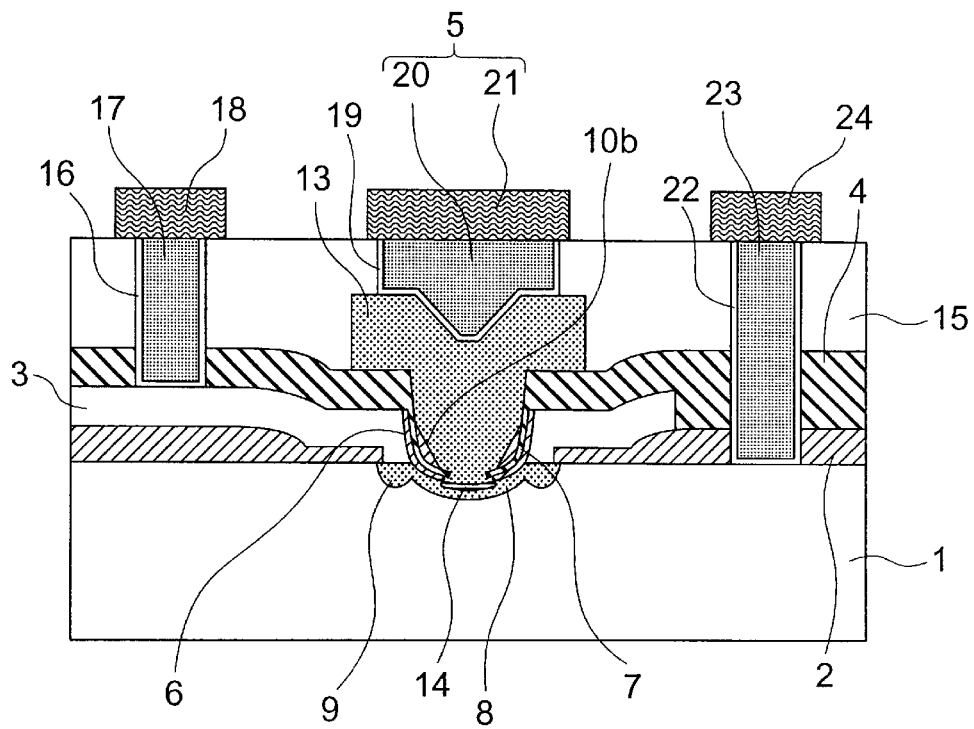
FIG. 1 is a sectional view of a semiconductor device according to a first embodiment of the present invention.

Now, the present invention is more specifically described with reference to accompanying drawings, wherein similar constituent elements are designated by similar reference numerals.

Referring to FIG. 1, a bipolar transistor is formed in a semiconductor device, which includes a silicon substrate 1, on which a first silicon oxide film 2, a first polysilicon layer 3, a first silicon nitride film 4 and a first interlayer dielectric film 15 are consecutively formed.

An intrinsic base 8 and an emitter 14 are consecutively formed in the central area of the bipolar transistor, and a second silicon oxide film 6 and a second silicon nitride film 7 are consecutively formed on the emitter 14. On the outer periphery of the intrinsic base 8, a graft base or external base 9 is formed. A second polysilicon layer 13 is formed within and above an opening 5 formed in the first polysilicon layer 3, which has an inner wall covered by the second silicon nitride film 7. An emitter lead electrode 20 is formed on the second polysilicon layer 13 with an intervention of an emitter barrier metal layer 19, and an emitter electrode 21 is formed on the emitter lead electrode 20.

A base barrier metal layer 16 with a hollow cylindrical shape having a bottom in contact with the first polysilicon layer 3 is formed on one of the edges of the bipolar transistor as a contact plug, penetrating the first interlayer dielectric film 15 and the first silicon nitride film 4. A cylindrical base lead electrode 17 is formed within the base barrier metal layer 16, and has a top on which a base electrode 18 is formed.

A collector barrier metal layer 22 with a hollow cylindrical shape having a bottom in contact with the silicon substrate 1 is formed on the opposing edge of the bipolar transistor as a contact plug, penetrating the first silicon nitride film 4 and the silicon oxide film 2. A cylindrical collector lead electrode 23 is formed within the collector barrier metal layer 22, having a top on which a collector electrode 24 is formed.

Now, the process for forming the semiconductor device of the first embodiment is described with reference to FIG. 2. The process begins with a silicon substrate 1 doped with phosphorous at an impurity concentration of $2.0 \times 10^{17}$ cm$^{-3}$, on which a first silicon oxide film 2 is formed by a thermal oxidation technique. A portion of the first silicon oxide film 2 is selectively etched by an ordinary photolithographic etching technique to have an opening exposing a region for the base and emitter.

Subsequently, a first polysilicon layer 3 is formed on the first silicon oxide film 2 by a CVD technique, followed by implanting boron into the first silicon polysilicon layer 3 by ion-implantation, for example, at an acceleration energy of 10 to 20 keV with a dosage of $1 \times 10^{15}$ to $8 \times 10^{15}$ cm$^{-2}$.

Subsequently, a portion of the first polysilicon layer 3 on the region for the collector lead electrode 23 is selectively etched by an ordinary photolithographic etching technique. A first silicon nitride film 4 is then formed by a CVD technique on the first polysilicon layer 3 and the first silicon oxide film 2 exposed from the first polysilicon layer 3. Thereafter, the first polysilicon layer 3 and the silicon nitride film 4 are selectively etched to form an opening 5 exposing the base region except for the graft base 9 by using an ordinary photolithographic etching technique.

Subsequently, an isotropic dry etching process is conducted for the silicon substrate 1 exposed from the opening 5, wherein the etch rate is higher for silicon and lower for silicon nitride. This etch rate is obtained mainly by radicals in plasma wherein $CF_4$ and $O_2$ are introduced at flow rates of 30 to 150 sccm and 80 to 300 sccm, respectively, at a chamber pressure of 10 to 200 Pa. The etch rate alleviates the damage of the silicon substrate 1.

Subsequently, a wet etching process is conducted to further etch the silicon substrate 1, thereby removing the damage of the silicon substrate 1 caused by the isotropic dry etching for the intrinsic base in the opening 5. The wet etching uses, for example, a mixture of HF, HNO$_3$ and CH$_3$COOH as an etchant. The combination etching including consecutive isotropic dry etching and wet etching allows the surface of the silicon substrate 1 to form a smooth concave depression having a depth of 20 to 100 mm at a maximum. The presence of the smooth concave depression on the region for forming the base layer prevents the base-to-collector current from being concentrated in the vicinity of the graft base 9 in the resultant bipolar transistor.

A thermal oxidation process is then conducted to form a second silicon oxide film 6 on the wall and bottom of the opening 5.

In the experimental results, the consecutive isotropic dry etching and wet etching raised the emitter-base breakdown voltage up to 2.7 volts, whereas the isotropic dry etching alone provided an emitter-base breakdown voltage of 1.8 volts.

For example, if the impurity (phosphorous) concentration of the silicon substrate 1 is lower than $2.0 \times 10^{17}$ cm$^{-3}$, a collector layer having an impurity concentration of about $2.0 \times 10^{17}$ cm$^{-3}$ should be formed in the silicon substrate 1. For this purpose, phosphorous ions may be implanted through the second silicon oxide film 6 into the silicon substrate 1. This ion-implantation my be such that phosphorous ions, for example, are accelerated at an acceleration energy of 250 to 350 keV and implanted at a dosage of $4 \times 10^{12}$ cm$^{-2}$ to $6 \times 10^{12}$ cm$^{-2}$.

Subsequently, an ion-implantation process is conducted wherein boron ions are implanted through the second silicon oxide film 6 into the silicon substrate 1 to form the intrinsic base 8. Further, an annealing process is conducted to remedy the crystal defects caused by this ion-implantation, thereby diffusing the boron ions in the first polysilicon layer 3 toward the silicon substrate 1 to form the graft base 9. Thereafter, a second silicon nitride film 7 is formed by a CVD technique on the second silicon oxide film 6 in the opening 5.

The process for forming the intrinsic base 8 may use the conditions proposed in JP Patent Application 2000-350796, and the boron concentration of the graft base 9 may be $1 \times 10^{21}$ to $2 \times 10^{21}$ cm$^{-3}$. Referring to FIG. 3, there is shown a boron concentration profile of the intrinsic base 8 as viewed along the line A1-B1 in FIG. 2 after the annealing process. The boron concentration profile is obtained by secondary ion mass spectroscopy (SIMS). As understood from FIG. 3, the boron concentration resides at $4 \times 10^{18}$ cm$^{-3}$ at the top, and reduces down to $2 \times 10^{17}$ cm$^{-3}$ at the depth somewhat below 70 nm from the top.

A third silicon oxide film 10 is formed on the first silicon nitride film 4 and in the opening 5 by a CVD process, wherein TEOS, O$_2$, He and Ar are introduced at flow rates of 80 to 200 sccm, 1 to 10 sccm, 150 to 300 sccm, and 40 to 200 sccm, respectively, at a chamber pressure of 200 to 800 Pa. These process conditions achieve excellent coverage for the third silicon nitride film 10.

Figure 2:
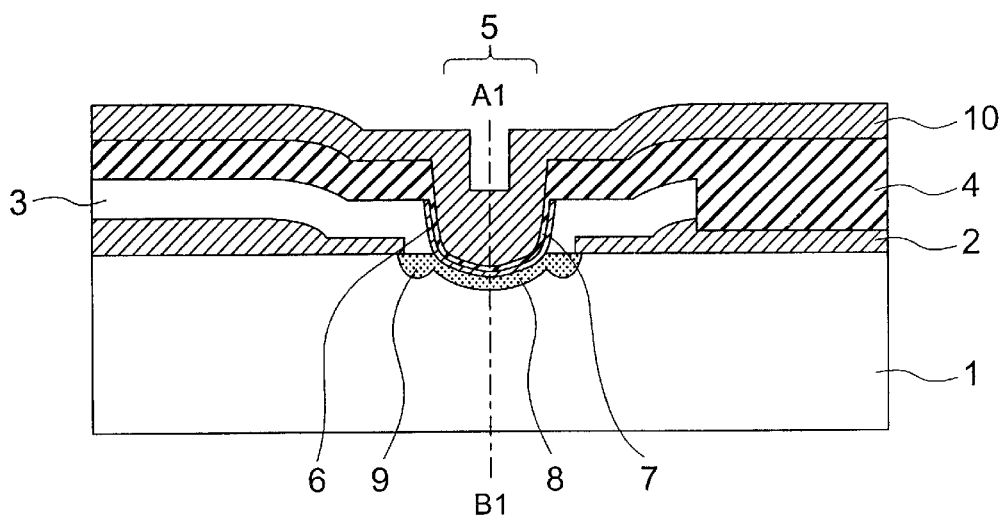
FIG. 2 is a sectional view of the semiconductor device of FIG. 1 during a step of fabrication process thereof.
Figure 3:
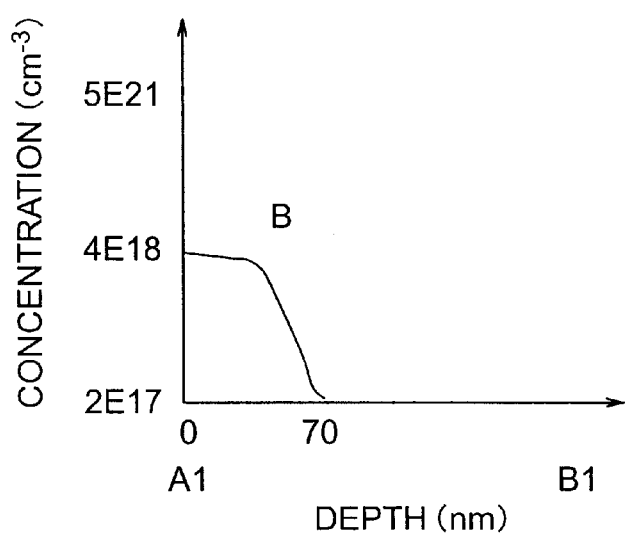
FIG. 3 is a graph showing a concentration profile of boron with respect to the depth-wise direction in FIG. 2.

The succeeding processes will be described with reference to FIGS. 4 to 6, wherein the portion of the opening 5 shown in FIG. 2 is enlarged.

Figure 4:
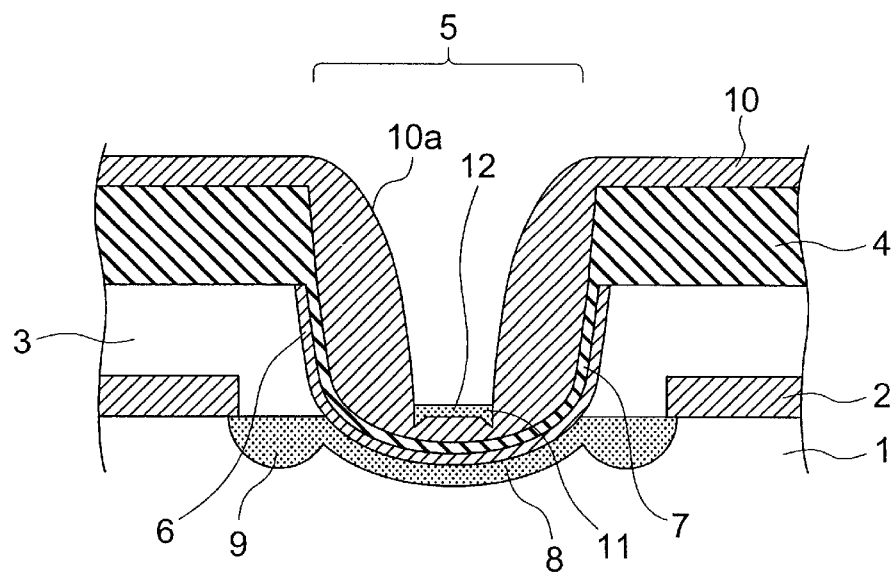
FIGS. 4 to 6 are sectional views of the semiconductor device of FIG. 1 in consecutive steps of fabrication process thereof.

As shown in FIG. 4, a first anisotropic dry etching process is conducted to etch a portion of the third silicon oxide 10 constituting the wall of the opening 5 to leave a first side-wall oxide film 10a. The first anisotropic dry etching is such that the etch rate for silicon oxide is higher than the etch rate for silicon nitride. In the first anisotropic dry etching, CF$_4$, CHF$_3$ and He are introduced into the chamber at flow rates of 10 to 200 sccm, 10 to 200 sccm and 20 to 300 sccm, respectively, while using reactive ions.

In the first anisotropic dry etching, the ions reflected by the wall of the opening 5 are concentrated onto the bottom edge of the opening 5, thereby forming a trench 11 at the bottom edge due to a large amount of etching. When the trench 11 is formed during the first anisotropic dry etching process, the etching for the side-wall oxide film 10a is stopped and a silica film is formed by coating in the trench, followed by baking thereof to form a step-alleviation film 12 which alleviates the step formed by the trench 11.

Figure 5:
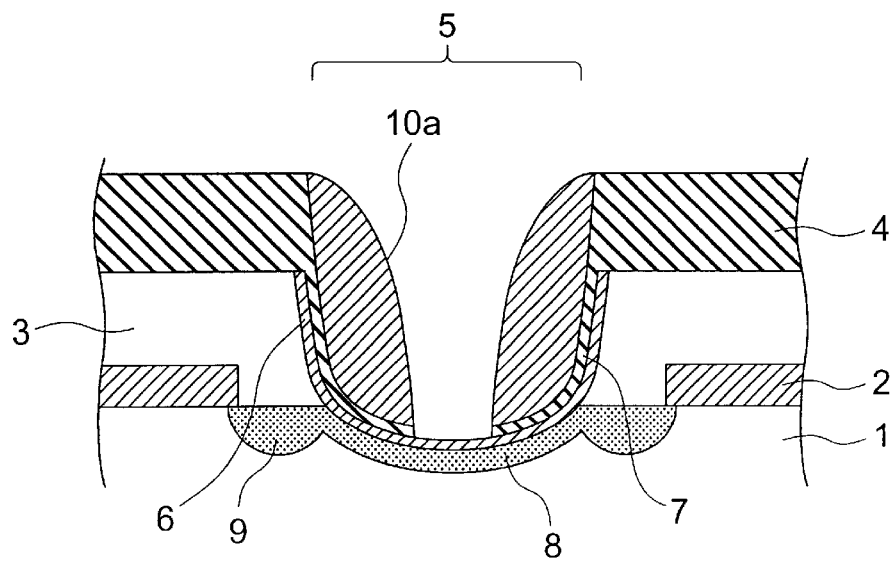

Subsequently, as shown in FIG. 5, a second anisotropic dry etching process similar to the first anisotropic dry etching process is conducted to the first side-wall oxide film 10a, whereby the step-alleviation film 12 on the emitter region and the third silicon oxide film 10 on the first silicon nitride film 4 are removed. The presence of the step-alleviation film 12 allows the second silicon nitride film 7 at the bottom of the cylinder to be removed, whereby the surface of the second silicon oxide film 6 is subjected to uniform over-etching, the cylinder being defined by the first side-wall oxide film 10a at this stage.

Subsequently, a third anisotropic dry etching process is conducted using the first side-wall oxide film 10a as a mask, thereby removing the second silicon oxide film 6 on the emitter region. The process conditions for the third anisotropic dry etching are such that the etch rate for silicon nitride is higher than the etch rate for silicon oxide. In the third anisotropic dry etching process, SF$_6$ and He are introduced at flow rates of 40 to 200 sccm and 50 to 250 sccm, respectively, while using reactive ions for etching.

Figure 6:
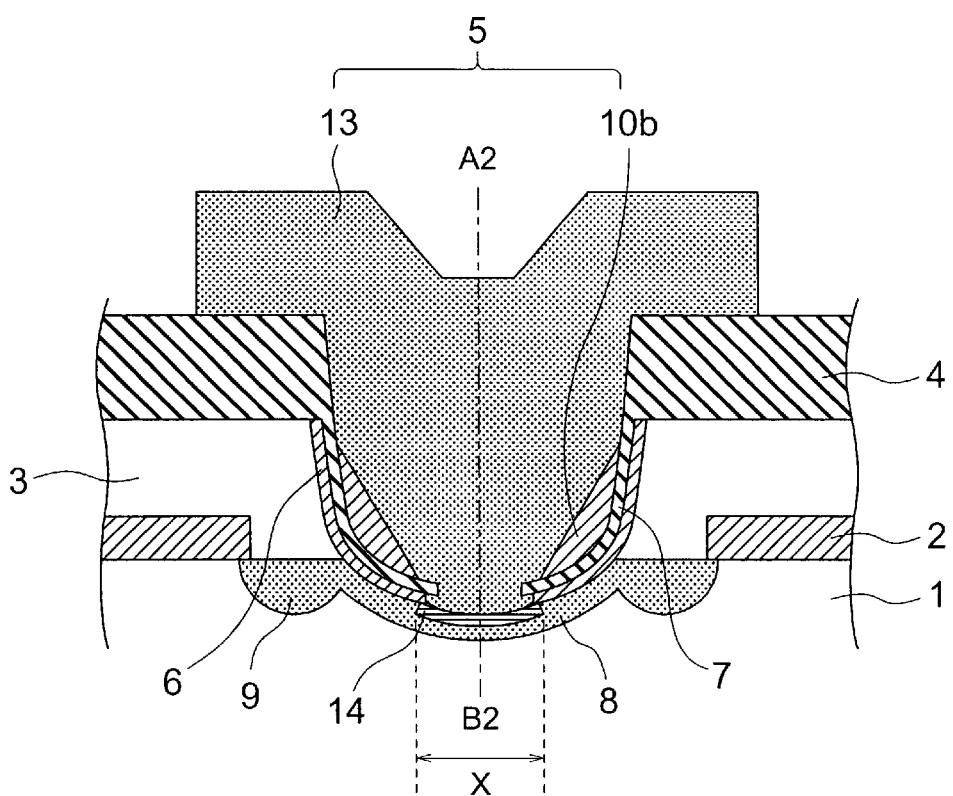

Subsequently, as shown in FIG. 6, a portion of the second silicon oxide film 6 on the emitter region is removed by wet etching under the etching conditions that render the effective emitter width X to be minimum. This wet etching uses a hydrofluoric acid based liquid, for example.

The second silicon oxide film 6, as formed by a thermal oxidation process, has a lower etch rate with respect to the hydrofluoric acid based liquid whereas the first side-wall oxide film 10a, as formed by a CVD process, has a higher etch rate with respect to the hydrofluoric acid based liquid. Thus, after the wet etching, a portion of the first side-wall oxide film 10a is left as a second side-wall oxide film 10b on the wall of the opening 5.

Subsequently, a native oxide film formed on the surface of the intrinsic base 8 is removed by wet etching using a hydrofluoric acid based liquid, followed by depositing a second polysilicon layer 13 to fill the opening 5 while introducing SiH$_4$ gas etc, into the chamber. The second polysilicon layer 13 is then doped with arsenic ions by using an ion-implantation technique.

Figure 7:
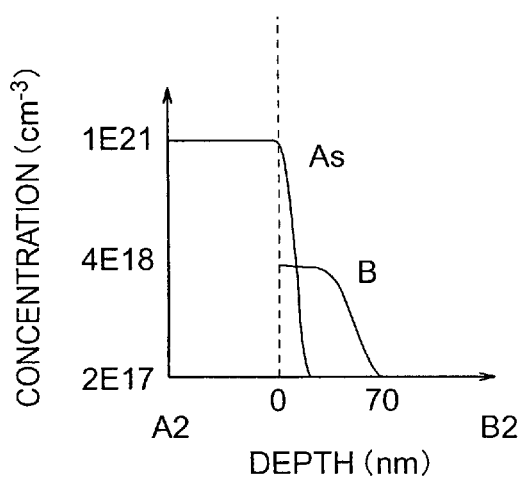
FIG. 7 is a graph showing concentration profiles of boron and arsenic with respect to the depth-wise direction in FIG. 6.

Subsequently, an emitter injection treatment is conducted using a lamp anneal technique, wherein arsenic ions in the second polysilicon layer 13 are thermally diffused through the opening of the second silicon oxide film 6 toward the surface of the intrinsic base 8 exposed from the opening 5, thereby forming the emitter 14. The lamp anneal process may use the conditions described in JP Patent Application 2000-350796. FIG. 7 shows the results of SIMS for detecting the boron and arsenic profiles of the second polysilicon layer 13 and the intrinsic base 8 after the emitter injection treatment, as viewed along line A2-B2 of FIG. 6.

In FIG. 7, the arsenic concentration of the second polysilicon layer 13 resides at $1 \times 10^{21}$ cm$^{-3}$ at a depth of 0 nm and reduces down to $2 \times 10^{17}$ cm$^{-3}$ at the depth somewhat below 0 nm, whereas the boron concentration of the silicon substrate 1 resides at $4 \times 10^{18}$ cm$^{-3}$ at a depth of 0 nm and reduces down to $2 \times 10^{17}$ cm$^{-3}$ at a depth of 70 nm.

After removing a portion of the second polysilicon layer 13, as shown in FIG. 1, a first interlayer dielectric film 15 is formed on the first silicon nitride film 4 and the second polysilicon layer 13. The first interlayer dielectric film 15 may be any insulator film and is a BPSG (boron-phosphorsilicate glass) film, for example, in this embodiment. The BPSG film is formed conveniently under a low temperature range, and has a higher capability for alleviating a step difference of the underlying film.

Subsequently, a through-hole having a diameter smaller than the outer diameter of the second polysilicon layer 13 is formed in the first interlayer dielectric film 15 for later receiving therein an emitter electrode. An emitter barrier metal layer 19 is deposited on the bottom and the inner wall of the through-hole, followed by forming an emitter lead electrode 20 filling the through-hole on the emitter barrier metal layer 19. The emitter lead electrode 20 has a top surface flush with the top of the first interlayer dielectric film 15.

Thereafter, an emitter electrode 21 having a planar size larger than the outer size of the emitter barrier metal layer 19 is formed on top of the emitter lead electrode 20. Similarly, a base barrier metal layer 16, a base lead electrode 17 and a base electrode 18 as well as a collector barrier metal layer 22, a collector lead electrode 23 and a collector electrode 24 are formed as the electrode structures of the base and collector, to obtain a bipolar transistor in the semiconductor device.

The barrier metal layers 16, 19 and 22 may be made of titanium, tungsten, a nitride of one of transition metals, and a silicide of boron, carbide etc. In a specific example in the present embodiment, each of the barrier metal layers 16, 19 and 22 is made of titanium/titanium nitride films.

Each of the base lead electrode 17, emitter lead electrode 20 and collector lead electrode 23 may be made of titanium or tungsten, and is made of tungsten in this example. Each of the base electrode 18, emitter electrode 21 and collector electrode 24 may be made of gold, silver, aluminum, an alloy of aluminum and barrier metal, an alloy of aluminum, copper and silicon, an alloy of copper, gold and barrier metal, an alloy of gold and barrier metal etc., and is made of an alloy of aluminum, copper and silicon in this example.

If the phosphorous concentration of the silicon substrate 1 is around $2.0 \times 10^{17}$ cm$^{-3}$, a collector lead wire may be bonded directly onto the bottom surface of the silicon substrate 1. This renders the collector barrier metal layer 22, collector lead electrode 23 and collector electrode 24 unnecessary.

In the present embodiment, since the damages of the silicon substrate 1 caused by the isotropic dry etching process are removed by the subsequent wet etching process, as described above with reference to FIG. 2, the crystal defects causing generation and recombination of the carriers can be reduced to thereby suppress the low-frequency noise. In addition, since the combination etching including the isotropic dry etching and wet etching forms a concave surface on the silicon substrate 1, the effective distance between the graft base 9 and the emitter 14 is increased without increasing the occupied area of the bipolar transistor, whereby the breakdown voltage of the emitter-base junction can be increased.

In the use of the combination of isotropic dry etching and wet etching, there is an optimum amount for etching the silicon substrate 1. If the etched amount in the silicon substrate is smaller than the optimum amount, a sufficient breakdown voltage cannot be obtained for the emitter-base junction because the insufficient depth of the concave surface on the silicon substrate 1 reduces the distance between the graft base and the emitter. On the other hand, if the etched amount is smaller than the optimum amount, the operational frequency of the bipolar transistor is reduced because the excessive depth of the concave surface on the silicon substrate 1 increases the distance between the graft base 9 and the emitter 14 to raise the base resistance of the bipolar transistor. Thus, it is important to determine the optimum amount for the combination etching.

The second side-wall oxide film 10b left on the wall of the opening 5 in FIG. 6 has a function for improving the coverage in depositing the second polysilicon layer 13, emitter barrier metal layer 19 and emitter lead electrode 20. More specifically, the presence of the second side-wall oxide film 10b renders smooth the bridging portion between the bottom and the wall of the opening 5, thereby suppressing occurrence of voids, otherwise caused by the corner portion, during deposition of the second polysilicon layer 13, emitter barrier metal layer 19 and emitter lead electrode 20.

Thus, the present embodiment provides an excellent structure wherein the emitter polysilicon layer 13 and emitter lead electrode 20 scarcely suffer from voids, even with an effective emitter width as small as 0.2 μm or smaller, thereby reducing the emitter resistance. In a specific example, if the emitter arsenic profile having a depth of 20 nm or less for an arsenic concentration of $2 \times 10^{17}$ cm$^{-3}$ is formed in the case of the base profile having a depth of 70 nm or less for a boron concentration of $2 \times 10^{17}$ cm$^{-3}$, then the base width is 50 nm or less. In this case, if the emitter has an effective emitter width of 0.2 μm or less, an emitter-base breakdown voltage of 2.7 volts can be obtained. In addition, if the bipolar transistor is used in an oscillator, the oscillator having a cut-off frequency (fT) of 43.2 GHz and a maximum oscillation frequency (fmax) of 42.4 GHz in the high-frequency characteristics thereof can be achieved for a collector-to-emitter voltage (Vce) of 1 volt.

As an alternative of the present embodiment, the concave is surface of the silicon substrate 1 may be achieved by wet etching alone without using the isotropic dry etching after forming the opening. In this case, the etchant having a higher etch rate for silicon compared to the etch rate for silicon nitride may be a mixture of HF, HNO$_3$ and CH$_3$COOH, which provides an etch depth of 20 to 100 nm at a maximum for the concave surface. The wet etching alone may achieve further reduction of low-frequency noise compared to the combination etching.

Figure 8:
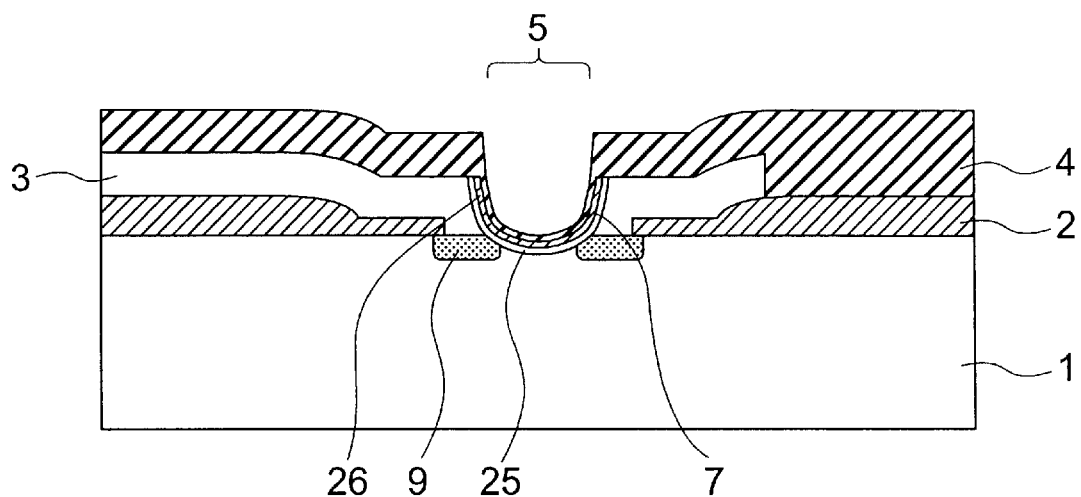
FIGS. 8 and 9 are sectional views of a semiconductor device in consecutive steps of fabrication process thereof according to a second embodiment of the present invention.

Referring to FIG. 8, there is shown a step for a fabrication process according to a second embodiment of the present invention. The fabrication steps of the present embodiment are similar to those of the first embodiment until the concave surface of the silicon substrate is obtained by using the combination etching. In the present embodiment, the intrinsic base is made of a compound semiconductor including Si, such as SiGe, instead of using ion-implantation.

More specifically, the present embodiment uses a lamp anneal process after the concave surface is formed, whereby boron ions in the first polysilicon layer 3 are diffused to the depression of the silicon substrate 1 by a solid phase diffusion to thereby form the graft base 9. Subsequently, the native oxide film on the silicon substrate 1 is removed using a hydrofluoric acid based liquid, followed by depositing a silicon-based compound semiconductor layer 25, such as including SiGe, in the opening 5 while adding boron. Thereafter, a fourth silicon oxide film 26 is deposited on the silicon-based compound semiconductor layer 25. The silicon-based compound semiconductor layer 25 such as including SiGe generally suffers from a problem in that the crystal strain is alleviated at a temperature of 1000 degrees C. or above to thereby generate crystal misalignment and degrade in the crystallinity. Thus, the fourth silicon oxide film 26 should be deposited using a CVD technique wherein a lower temperature such as around 400 degrees C. is appropriate for deposition.

Subsequently, an ordinary etching process is conducted, wherein a portion of the fourth silicon oxide film 26 on the first silicon nitride film 4 is removed, to leave the fourth silicon oxide film 26 only in the opening 5, followed by depositing a second silicon nitride film 7 on the remaining fourth silicon nitride film 26. The subsequent steps are similar to those in the first embodiment. By using the silicon-based compound semiconductor layer as the intrinsic base layer, excellent high-frequency characteristics can be obtained due to a higher carrier velocity resulting from a high internal electric field in the intrinsic base.

Figure 9:
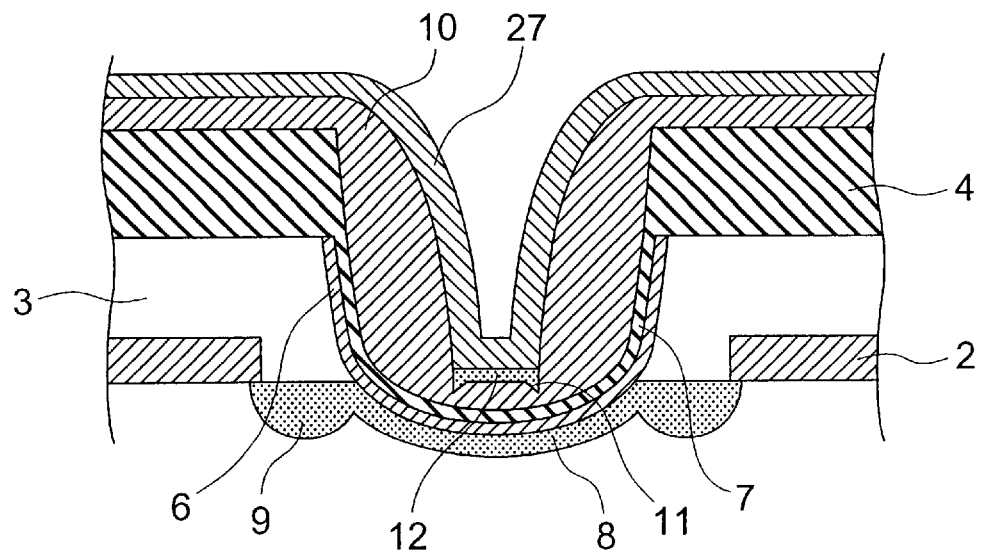
Figure 10:
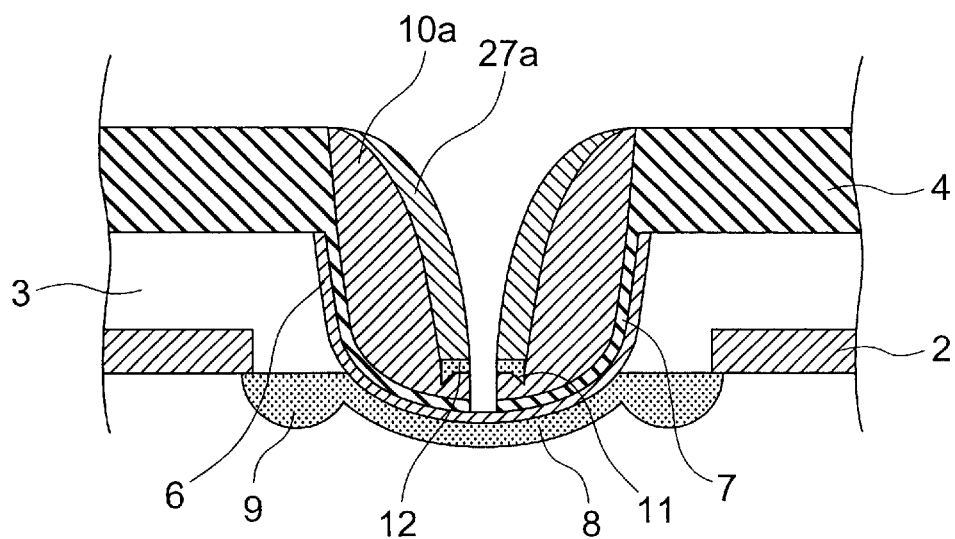
FIGS. 10 and 11 are sectional views of a semiconductor device in consecutive steps of fabrication process thereof according to a third embodiment of the present invention.

Referring to FIGS. 9 and 10, a method for fabricating a semiconductor device according to a third embodiment of the present invention will be described. In this embodiment, the process for forming the oxide film on the wall of the opening 5 is conducted twice, thereby further reducing the effective emitter width and improving the emitter-base breakdown voltage. In the present embodiment, the processes are similar to those in the first embodiment until the step-alleviation film 12 is formed.

FIGS. 9 and 10 are enlarged sectional views of the opening 5 in the semiconductor device, consecutively showing the steps of fabrication process thereof. After the step-alleviation film 12 is formed, as shown in FIG. 9, a fifth silicon oxide film 27 is deposited using a CVD technique on the third silicon oxide film 10 and the step-alleviation film 12. The conditions in this CVD process are similar to those used for forming the third silicon oxide film 10 in the first embodiment. Subsequently, a second anisotropic dry etching is conducted with the conditions similar to those in the first embodiment, to remove the fifth silicon oxide film 27, step-alleviation film 12 and the third silicon oxide film 10 on the emitter region.

Subsequently, as shown in FIG. 10, a third anisotropic dry etching is conducted with the conditions similar to those in the first embodiment, to remove the second silicon nitride film 7 on the emitter region while using the third side-wall oxide film 27a and the first side-wall oxide film 10a as a mask. The subsequent processes are similar to those in the first embodiment.

Figure 11:
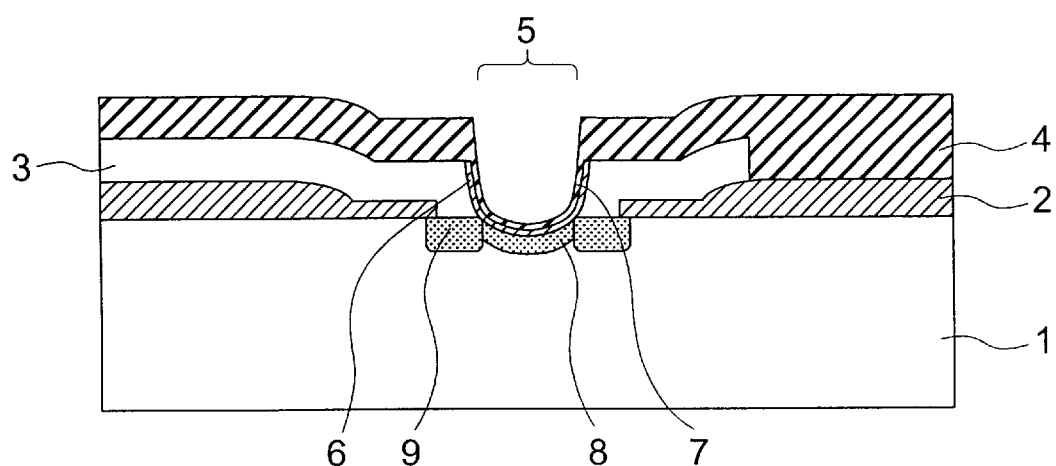
Figure 12:
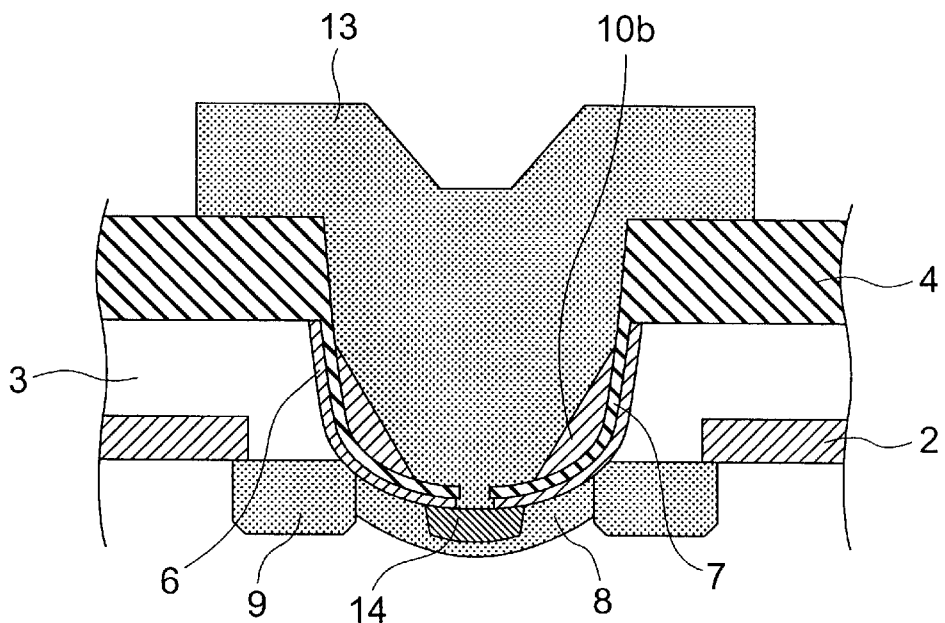
FIG. 12 is a sectional view of a semiconductor device in a step of fabrication process according to a fourth embodiment of the present invention.

Referring to FIGS. 11 and 12, a method according to a fourth embodiment of the present invention will be described. This embodiment achieves both reduction of the low-frequency noise and increase of the emitter-base breakdown voltage. The processes are similar to those in the first embodiment until the second silicon oxide film 6 is formed.

After the second silicon oxide film 6 is formed, as shown in FIG. 11, ion-implantation is conducted to implant boron ions through the second silicon oxide film 6 to the silicon substrate 1, thereby forming an intrinsic base 8. Thereafter, an anneal treatment is conducted to remove the crystal defects caused by the ion-implantation, wherein boron ions in the first polysilicon layer 3 are diffused into the silicon substrate 1 to form a graft base 9. Another anneal treatment is then conducted to increase the depths of the intrinsic base 8 and the graft base 9 by diffusing the ions therein. The steps from the deposition of the second silicon nitride film 7 to the ion-implantation using arsenic ions are similar to those in the first embodiment.

Subsequently, as shown in FIG. 12, the arsenic ions in the second polysilicon layer 13 are diffused by a solid phase diffusion into the silicon substrate 1 to form the emitter 14, wherein the process conditions are such that the emitter having an arsenic concentration of $2 \times 10^{17}$ $cm^{-3}$ has a thickness of 100 nm or more. The subsequent steps are similar to those in the first embodiment.

For reducing the low-frequency noise, it is important to suppress the generation and recombination of carriers. For this purpose, it is important to reduce the crystal defects causing the generation and recombination of carriers. The present inventors experimentally confirmed that the low-frequency noise could be reduced by forming the emitter at a depth of 100 nm or more at which the crystal defects were significantly reduced compared to the location of a smaller depth. Although the deep emitter expands by diffusion also in the lateral direction, the concave surface of the silicon surface obtained by the isotropic dry etching increases the distance between the graft base 9 and the emitter 14, thereby increasing the emitter-base breakdown voltage in the bipolar transistor.

Figure 13:
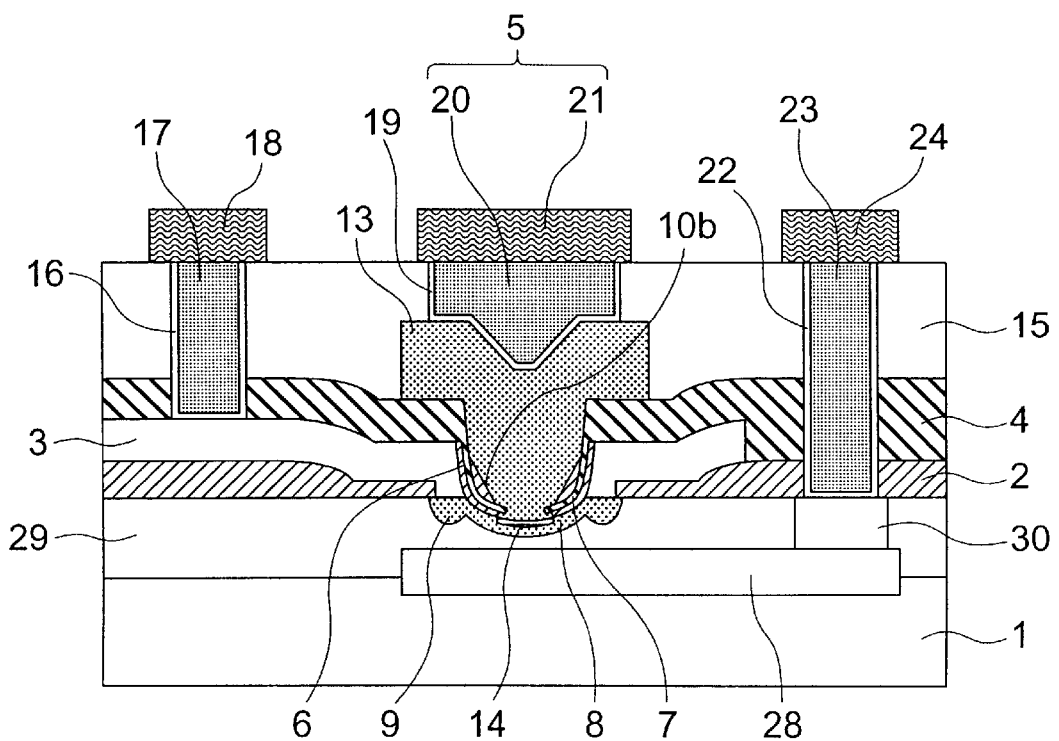
FIG. 13 is a sectional view of a semiconductor device in a step of fabrication process according to a fifth embodiment of the present invention.
Figure 14:
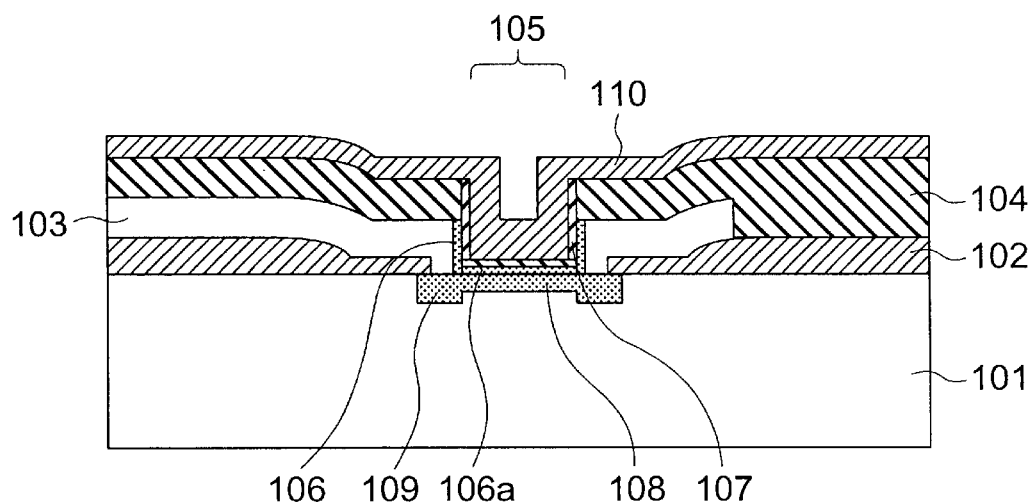
FIGS. 14 to 18 are sectional views of a conventional semiconductor device in consecutive steps of fabrication process thereof.
Figure 15:
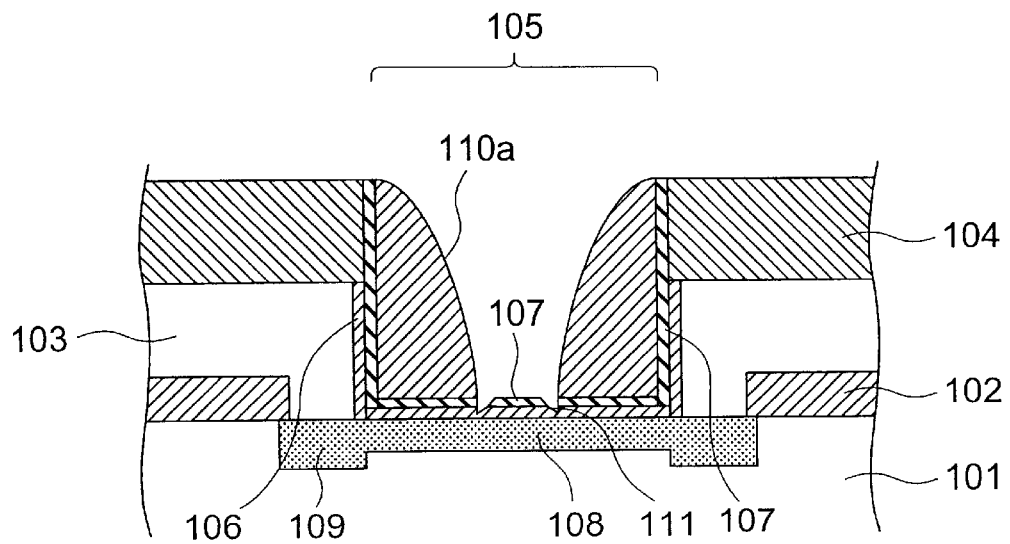
Figure 16:
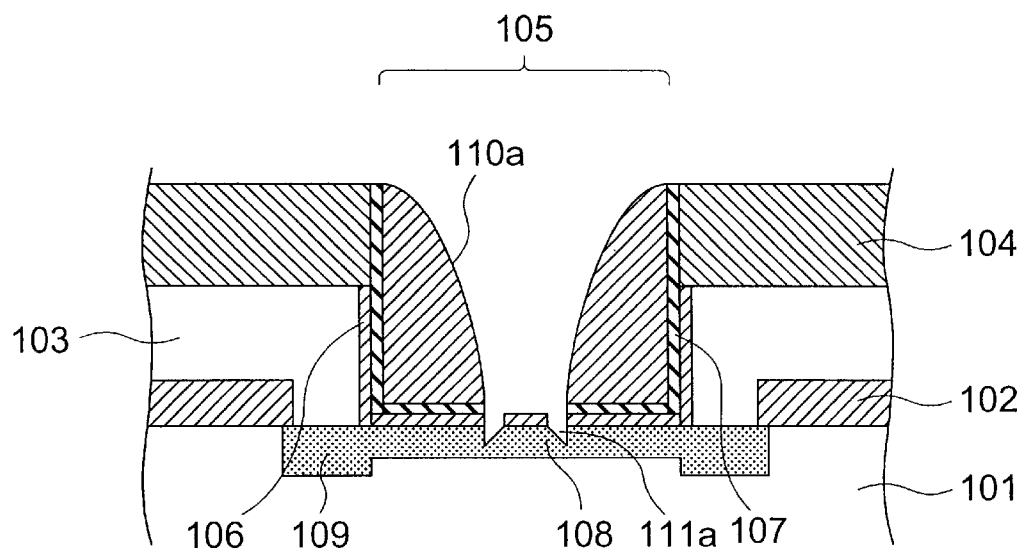
Figure 17:
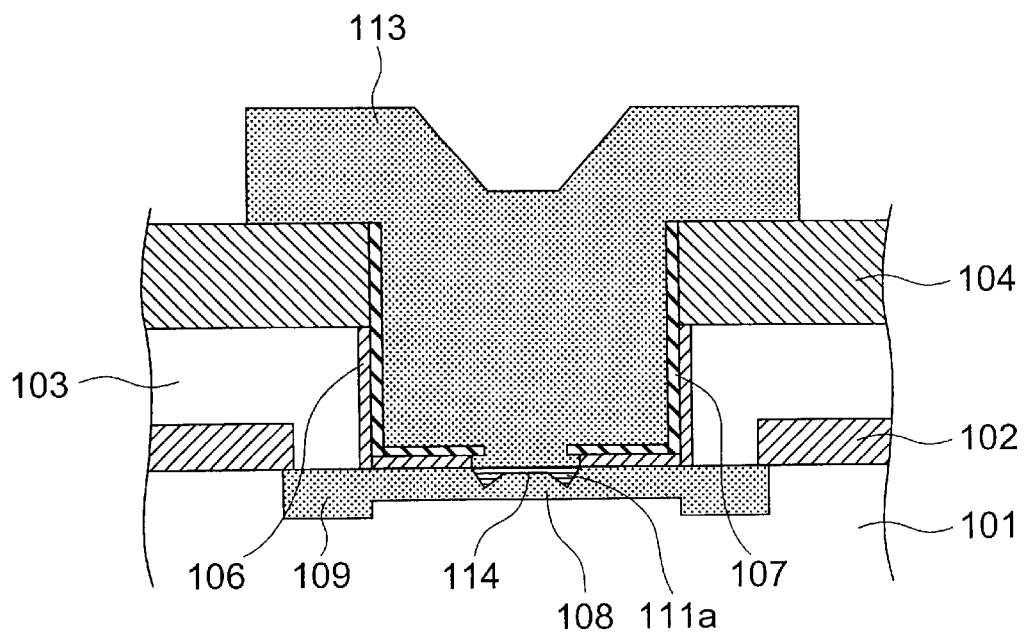
Figure 18:
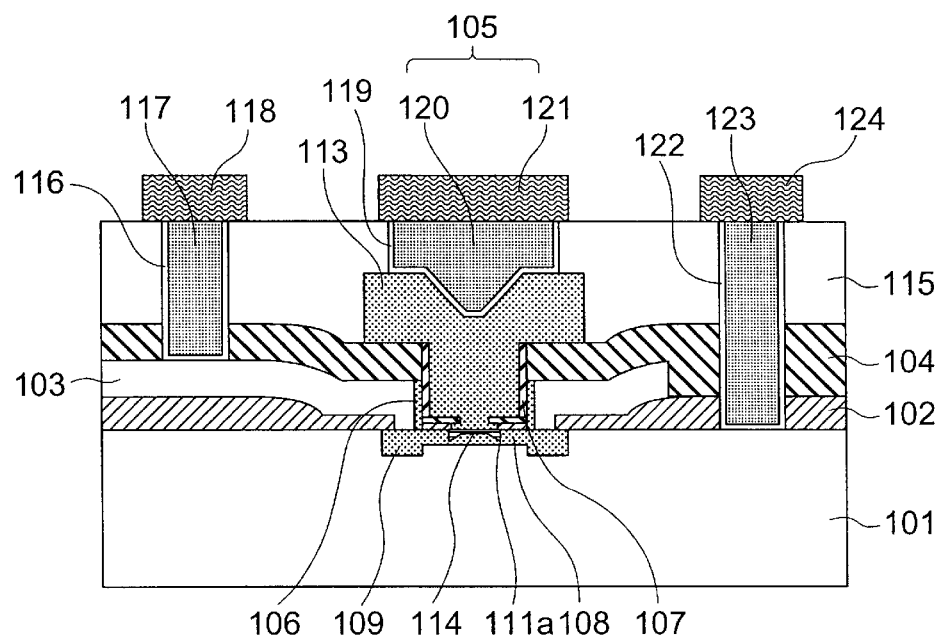

Referring to FIG. 13, a semiconductor device according to a fifth embodiment of the present invention will be described. The semiconductor device includes a silicon substrate 1, on which an $n^-$-type epitaxial layer 29 is formed. The concave surface, on which the intrinsic base 8 and the emitter 14 is formed, is formed on the $n^-$-type epitaxial layer 29. Between the silicon substrate 1 and the $n^-$-type epitaxial layer 29, an $n^{30}$-type buried layer 28 is provided. An $n^+$-type collector lead layer 30 is formed between the $n^-$-type epitaxial layer 29 and the bottom of the collector barrier metal layer 22.

In the present embodiment, provision of the $n^+$-type buried layer 28, $n^-$-type epitaxial layer 29 and $n^+$-type collector lead layer 30 reduces the collector resistance of the bipolar transistor. The constituent elements in the present embodiment other than the $n^+$-type buried layer 28, $n^-$-type epitaxial layer 29 and n+-type collector lead layer 30 are similar to those in the first embodiment.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a bipolar transistor in a semiconductor device, said method comprising the steps of:

forming a silicon layer on a semiconductor substrate;

selectively etching said silicon layer to form an opening for exposing a first portion of said semiconductor substrate;

conducting a combination etching to said first portion to form a concave surface thereon, said combination etching including consecutive isotropic dry etching and wet etching;

implanting first-conductivity type impurities through said concave surface to said first portion to form an intrinsic base; and implanting second-conductivity type impurities into a surface portion of said intrinsic base to form an emitter on said intrinsic base.

2. The method as defined in claim 1, further comprising, between said first-conductivity type impurities implanting step and said second-conductivity type impurities implanting step, intermediate steps including the steps of;

depositing a silicon oxide film in said opening;

conducting anisotropic-etching to said silicon oxide film to form therefrom a first side-wall oxide film on a wall of said opening; and forming a step-alleviation film on a bottom and a bottom corner portion of said opening before said silicon oxide film exposes said silicon substrate in said opening.

3. The method as defined in claim 2, wherein said intermediate steps further includes, after said step-alleviation film forming step, the consecutive steps of:

anisotropic-etching said step-alleviation film and said first side-wall oxide film to form a second side-wall oxide film from said first side-wall oxide film;

conducting another combination etching using said second side-wall oxide film as a mask in said opening to expose said surface portion, said another combination etching including consecutive another anisotropic dry etching and wet etching.

4. The method as defined in claim 2, wherein said intermediate steps further includes, after said step alleviation film forming step, the consecutive steps of:

depositing a second side-wall oxide film on said first side-wall oxide film and said step-alleviation film;

anisotropic-etching said step-alleviation film and said second side-wall oxide film;

conducting another combination etching using said second side-wall oxide film as a mask in said opening to expose said surface portion, said another combination etching including consecutive anisotropic dry etching and wet etching.

5. The method as defined in claim 1, wherein said concave surface has a depth of 20 to 100 nm.

* * * * *